(12) United States Patent
Zhu et al.

(10) Patent No.: US 12,375,090 B2
(45) Date of Patent: Jul. 29, 2025

(54) ULTRA-FAST FREQUENCY SUPPORT FOR POWER ELECTRONIC CONVERTERS

(71) Applicant: HUAZHONG UNIVERSITY OF SCIENCE AND TECHNOLOGY, Hubei (CN)

(72) Inventors: Donghai Zhu, Hubei (CN); Yini Zhou, Hubei (CN); Jiabing Hu, Hubei (CN); Xudong Zou, Hubei (CN); Yong Kang, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 72 days.

(21) Appl. No.: 18/433,461

(22) Filed: Feb. 6, 2024

(65) Prior Publication Data
US 2025/0183900 A1   Jun. 5, 2025

(30) Foreign Application Priority Data
Nov. 30, 2023   (CN) .......................... 202311639860.5

(51) Int. Cl.
*H03L 7/085* (2006.01)
*H02P 9/00* (2006.01)

(52) U.S. Cl.
CPC .............. *H03L 7/085* (2013.01); *H02P 9/007* (2013.01)

(58) Field of Classification Search
CPC .. H03L 7/085; H03L 7/08; H02P 9/007; H02J 3/241; H02J 3/381; H02J 3/466; H02J 2300/20; H02J 2300/28; H02J 2300/40
See application file for complete search history.

(56) References Cited

U.S. PATENT DOCUMENTS

2024/0222973 A1*   7/2024   Zhang ....................... H02J 3/08

\* cited by examiner

*Primary Examiner* — Jeffrey M Shin
(74) *Attorney, Agent, or Firm* — JCIPRNET (57) ABSTRACT

The disclosure discloses a phase-locked loop optimization method and device for ultra-fast frequency support for power electronic converters, and belongs to the technical field of new energy power generation control. The disclosure adds a phase step link to the traditional phase-locked loop structure. When it is detected that the system frequency index exceeds the limit, a phase angle difference is instantly added to the phase-locked loop output angle, this enables the power electronic converter to quickly output power after the frequency drops, effectively improving the system frequency change rate and the frequency nadir. At the same time, the original phase-locked loop control structure is retained, which does not affect the design of the original phase-locked loop controller parameters and does not sacrifice the original dynamic performance of the phase-locked loop.

8 Claims, 6 Drawing Sheets

ULTRA-FAST FREQUENCY SUPPORT FOR POWER ELECTRONIC CONVERTERS

CROSS-REFERENCE TO RELATED APPLICATION

This application claims the priority benefit of China application serial no. 202311639860.5, filed on Nov. 30, 2023. The entirety of the above-mentioned patent application is hereby incorporated by reference herein and made a part of this specification.

BACKGROUND

Technical Field

The disclosure belongs to the technical field of new energy power generation control, and specifically, relates to a ultra-fast frequency support for power electronic converter.

Description of Related Art

Double-fed induction generator (DFIG)-based wind turbines (WTs), as typical new energy power generation equipment, are connected to the power grid through back-to-back power electronic converters, causing the rotor speed to be decoupled from the grid frequency. That is, the DFIG-based WTs cannot respond to system frequency changes, so that the power system inertia gradually decreases and thus it is difficult to resist system frequency disturbances. In recent years, frequency accidents in power systems caused by low inertia occur frequently, such as major blackouts in the UK and Australia.

In order to realize the ultra-fast frequency support for power electronic converters, existing technologies have proposed additional energy storage control, power backup control, Virtual synchronous generator (VSG) control, and df/dt control, all of which can improve the frequency dynamics of the system. However, the first two strategies require additional energy storage equipment or deload operation, which have the disadvantages of high cost and not economical. Although being able to simulate the inertia and damping characteristics of synchronous generators, VSG control has not yet been implemented in actual projects due to problems such as transient overcurrent. df/dt control is currently a widely used network-based inertia control method, whose control is simple and does not require sacrificing the economy of power electronic converters. However, frequency measurement requires sliding window filtering, resulting in a slow response speed.

In addition to the above-mentioned methods of modifying the outer loop control structure, some scholars have also proposed some methods of modifying the parameters or structure of the phase-locked loop, which can be mainly divided into reducing the bandwidth of the phase-locked loop and adding frequency response links to the phase-locked angle. However, these control methods all have the problem of slow inertia response speed and thus it is hard to achieve a fast frequency support.

SUMMARY

In view of the shortcomings of the existing technology, the purpose of the disclosure is to provide a phase-locked loop optimization method and device for ultra-fast frequency support for power electronic converters, aiming to solve the problem of slow response speed of the existing inertia support method.

In order to achieve the above purpose, in the first aspect, the disclosure provides a phase-locked loop optimization method for ultra-fast frequency support for power electronic converters, which includes the following. When a frequency accident in the new energy power system is detected, phase angle step control is immediately triggered. The specific control process is as follows: obtaining an initial moment measured when the frequency accident occurs, a trigger moment of the phase angle step control, and a system frequency at the trigger moment of the phase angle step control and calculating a phase angle difference; superimposing the phase angle difference to an original output angle of a phase-locked loop to obtain a new output angle of the phase-locked loop; and using the new output angle in all coordinate transformation links of new energy power generation control except the phase-locked loop.

Preferably, a criterion for the frequency accident in the new energy power system is as follows: a frequency change rate of a grid connection point of a power electronic converter exceeds a preset value thereof or a frequency deviation of the grid connection point of the power electronic converter exceeds a preset value thereof.

Preferably, the preset value of the frequency change rate is 0.3 Hz/s, and the preset value of the frequency deviation is in a range of 0.03 Hz to 0.1 Hz.

Preferably, a calculation formula of the phase angle difference $\Delta\theta_{add}$ is as follows.

$$\Delta\theta_{add} = K * \frac{f_0 - f_1}{t_1 - t_0}$$

K is the step coefficient, $t_0$ is the initial moment when the frequency accident occurs, $f_0$ is the initial steady-state frequency when the frequency accident occurs, $t_1$ is a trigger moment of the phase angle step control, and $f_1$ is the system frequency at the trigger moment of the phase angle step control.

It should be noted that the ratio of frequency deviation to time difference is introduced into the amplitude size of the phase angle step, so that frequency support can be achieved under load disturbances of different sizes, thereby a good adaptability is provided.

Preferably, the original output angle of the phase-locked loop is a phase of a stator three-phase AC voltage obtained through the phase-locked loop.

Preferably, the method is applicable to any phase-locked loop without additional control.

In order to achieve the above purpose, in the second aspect, the disclosure provides a phase-locked loop optimization device for ultra-fast frequency support for power electronic converters including a processor and a storage, in which the storage is configured to store computer execution commands, and the processor is configured to execute the computer execution commands so that the method described in the first aspect is performed.

In order to achieve the above purpose, in the third aspect, the disclosure provides a non-transitory computer-readable storage medium, and the non-transitory computer-readable storage medium stores a computer program. When the computer program is executed by a processor, steps of the phase-locked loop optimization method as described in the first aspect are implemented.

Generally speaking, compared with the related art, the technical solution conceived by the disclosure has beneficial effects as follows.

The disclosure discloses a phase-locked loop optimization method and device for ultra-fast frequency support for power electronic converters. A phase step link is added to the traditional phase-locked loop structure, when it is detected that the system frequency index exceeds the limit, a phase angle difference is instantly added to the phase-locked loop output angle, thereby realizing the rapid output of power electronic converters after the frequency drops, effectively improving the system frequency change rate and the frequency nadir. At the same time, the original phase-locked loop control structure is retained, which does not affect the design of the original phase-locked loop controller parameters and does not sacrifice the original dynamic performance of the phase-locked loop.

DESCRIPTION OF THE EMBODIMENTS

In order to make the purpose, technical solutions, and advantages of the disclosure more comprehensible, the disclosure is further described in detail below with reference to the accompanying drawings and embodiments. It should be understood that the specific embodiments described here are merely used to illustrate the disclosure rather than to limit the disclosure.

Figure 1:
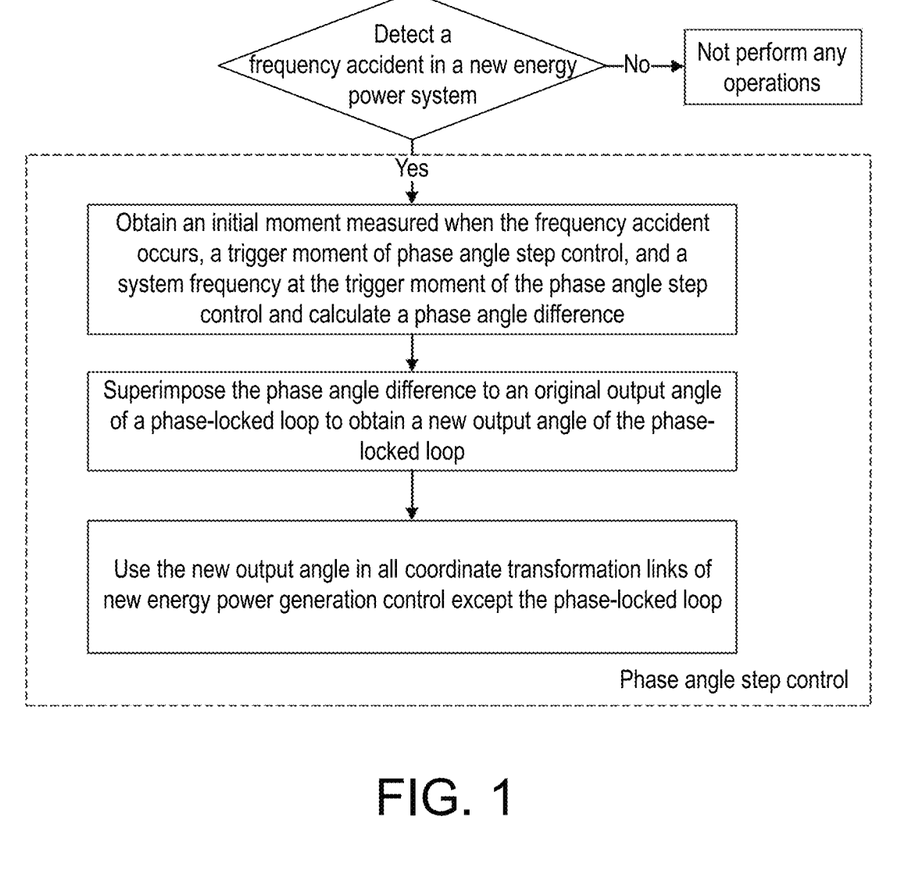
FIG. 1 is a flow chart of a phase-locked loop optimization method for ultra-fast frequency support for power electronic converters according to an embodiment of the disclosure.

As shown in FIG. 1, the disclosure provides a phase-locked loop optimization method for ultra-fast frequency support for power electronic converters, which includes the following. When a frequency accident in the new energy power system is detected, phase angle step control is immediately triggered. The specific control process is as follows: obtaining an initial moment measured when the frequency accident occurs, a trigger moment of the phase angle step control, and a system frequency at the trigger moment of the phase angle step control and calculating a phase angle difference; superimposing the phase angle difference to an original output angle of a phase-locked loop to obtain a new output angle of the phase-locked loop; and using the new output angle in all coordinate transformation links of new energy power generation control except the phase-locked loop.

Preferably, a criterion for the frequency accident in the new energy power system is as follows: a frequency change rate of a grid connection point of a power electronic converter exceeds a preset value thereof or a frequency deviation of the grid connection point of the power electronic converter exceeds a preset value thereof.

Preferably, the preset value of the frequency change rate is 0.3 Hz/s, and the preset value of the frequency deviation is in a range of 0.03 Hz to 0.1 Hz.

Preferably, a calculation formula of the phase angle difference $\Delta\theta_{add}$ is as follows.

$$\Delta\theta_{add} = K * \frac{f_0 - f_1}{t_1 - t_0}$$

K is the step coefficient, $t_0$ is the initial moment when the frequency accident occurs, $f_0$ is the initial steady-state frequency when the frequency accident occurs, $t_1$ is a trigger moment of the phase angle step control, and $f_1$ is the system frequency at the trigger moment of the phase angle step control.

Preferably, the original output angle of the phase-locked loop is a phase of a stator three-phase AC voltage obtained through the phase-locked loop.

Preferably, the method is applicable to any phase-locked loop without additional control.

The power electronic converter includes but is not limited to power generation equipment connected to the grid through power electronic converters such as DFIG-based WTs, direct-drive wind turbines, and photovoltaics.

Embodiment 1

In this embodiment, the phase $\theta_{pll}$ of the stator three-phase AC voltage is obtained through a phase-locked loop.

The phase-locked loop includes a phase detector, a PI controller, and an integral link 1/S.

The phase detector is configured to convert the stator AC voltage in the three-phase AC abc coordinate system to the two-phase DC dq-axis coordinate system to obtain the q-axis component $U_{sq}$ of the stator voltage of the wind turbine.

The PI controller is configured to control the input signal $U_{sq}$ to 0 to realize the orientation of the stator voltage to the d-axis and output the angular frequency $\omega_{pll}$.

The integration link is configured to input the angular frequency $\omega_{pll}$ and output the original phase lock angle $\theta_{pll}$.

Based on the original phase-locked loop, this embodiment adds a frequency detection link and a phase angle step control loop.

The frequency detection link is configured to detect whether the frequency change rate of the DFIG-based WT grid connection point and the signal of the frequency deviation exceed the limit. Once one of the two conditions is met, the trigger signal is immediately set from 0 to 1, and the signal is used as a determining criterion for connecting the phase angle step control loop.

In this embodiment, the criteria for exceeding the limit of the frequency change rate and the frequency deviation are |df/dt|>0.3 Hz/s and |Δf|>0.03 Hz respectively.

In the phase angle step control loop, a step signal generates a phase angle difference $\Delta\theta_{add}$. When the trigger signal is 1, the phase angle difference is added to the original phase locking angle $\theta_{pll}$ to obtain a new phase locking angle $\theta_{pll}'$. This phase angle is also used in all coordinate transformation links of new energy power generation control except the phase-locked loop.

Further, the phase angle difference $\Delta\theta_{add}$ is as follows.

$$\Delta\theta_{add} = K * \frac{f_0 - f_1}{t_1 - t_0}$$

$t_0$ is the initial moment when the frequency accident occurs, $f_0$ is the initial steady-state frequency when the frequency accident occurs, which is 50 Hz in this embodiment, $t_1$ is a trigger moment of the phase angle step control, and $f_1$ is the system frequency at the trigger moment of the phase angle step control. $t_0$, $t_1$, and $f_1$ can be obtained according to the actual measurement of the system. K is the step coefficient, and the value thereof is designed according to the size of $t_0$, $t_1$, and $f_1$.

Figure 2:
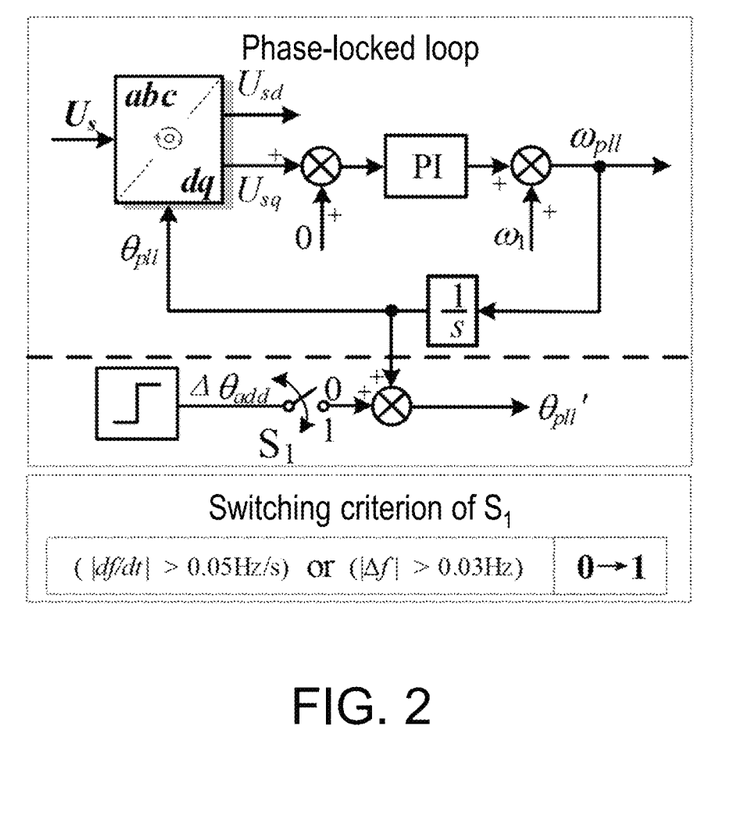
FIG. 2 is a phase-locked loop control structure diagram for improving the inertia response speed of new energy sources according to an embodiment of the disclosure.

The phase-locked loop control structure used in the disclosure is shown in FIG. 2, in which $U_{sabc}$ is the grid connection point voltage signal in the three-phase AC coordinate system. After coordinate transformation, the q-axis component $U_{sq}$ of the grid connection point voltage in the phase-locked coordinate system is obtained; the error signal between $U_{sq}$ and 0 is sent to the phase-locked loop PI controller to achieve the stator terminal voltage orientation in steady state; the output of the phase-locked loop PI controller is a small signal of the phase-locked loop angular frequency; $\omega_1$ is the steady-state angular frequency of the system, size is $100\pi$; the system angular frequency $\omega_{pll}$ is passed through the integration link 1/S to obtain the phase-locked loop output phase angle $\theta_{pll}$; when the system frequency change rate or frequency deviation exceeds the dead zone limit, that is, $|df/dt|>0.3$ Hz/s and $|\Delta f|>0.03$ Hz, the trigger signal of the phase angle step control is set to 1 and the step signal is connected to obtain the phase angle difference $\Delta\theta_{pll}$; the phase-locked loop output the phase angle $\theta_{pll}$ to be used in each coordinate transformation link.

Specifically, the q-axis voltage component of the grid connection point is as follows.

$$U_{sq} = U_s \sin(\theta_s - \theta_{pll})$$

$U_s$ is the voltage signal of the grid connection point, $U_{sq}$ is the q-axis voltage component of the grid connection point, and $\theta_s$ is the stator voltage phase angle.

By linearizing the q-axis voltage component of the grid connection point, the following is obtained.

$$\Delta U_{sq} = U_s \cos(\theta_{s0} - \theta_{pll0})(\Delta\theta_s - \Delta\theta_{pll}) \approx (\Delta\theta_s - \Delta\theta_{pll})$$

A $\Delta U_{sq}$ is the change of the q-axis voltage component of the grid connection point during the dynamic process, and $(\Delta\theta_S - \Delta\theta_{pll})$ is the phase angle deviation information between the grid connection point voltage signal $U_s$ and the signal $U_{pll}$ generated by the internal oscillator of the phase-locked loop.

Figure 3:
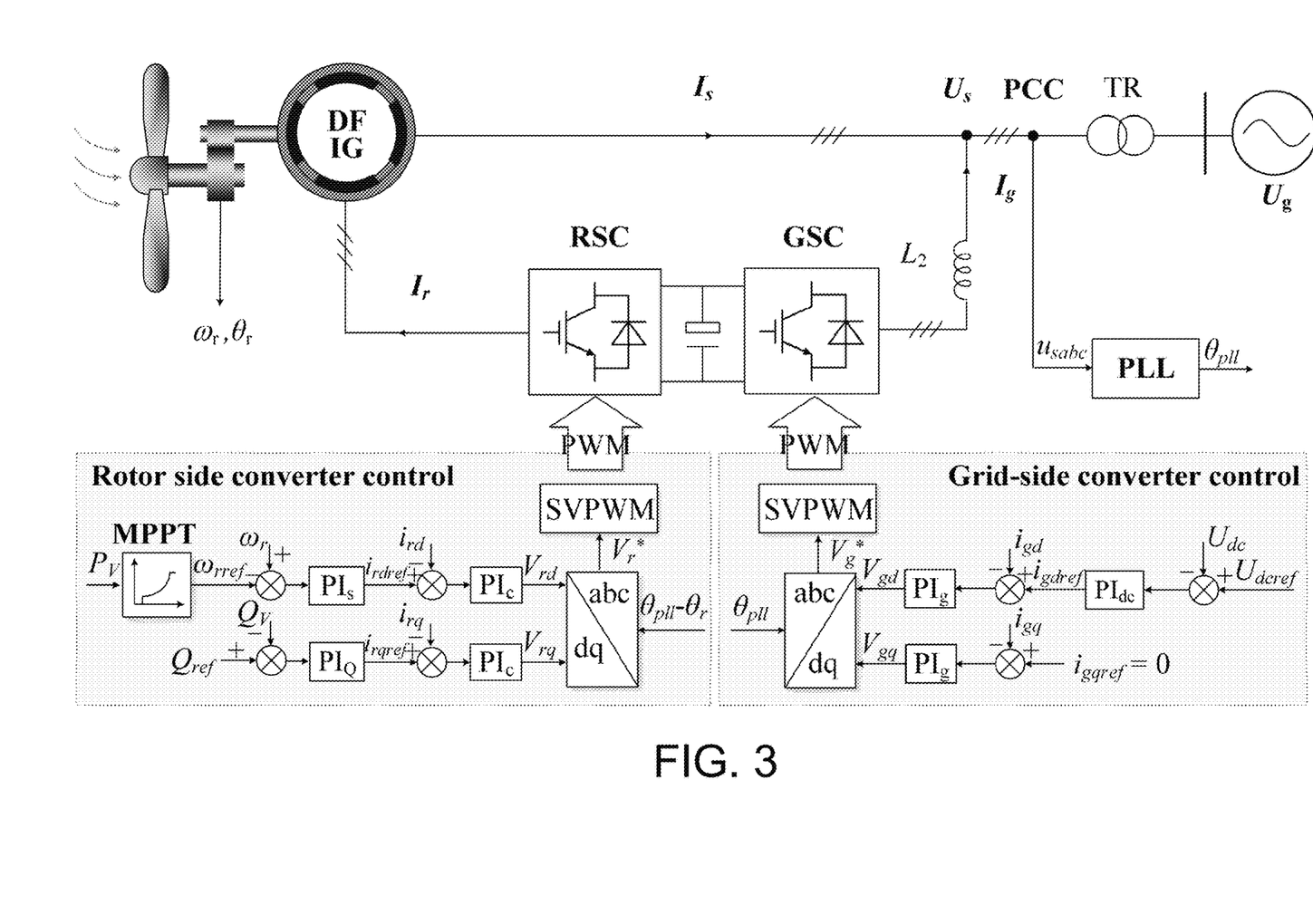
FIG. 3 is a topology and control structure diagram of a wind turbine according to an embodiment of the disclosure.

As shown in FIG. 3, the phase-locked loop is used to obtain the phase angle signal of the grid connection point voltage to achieve phase synchronization between the stator voltage of the DFIG-based WT and the grid connection point voltage. In order to achieve a fast inertia response to power grid frequency events, the disclosure uses a phase-locked loop added with phase angle step control. The grid-side converter GSC control comprises a DC voltage outer loop and a grid-side current inner loop, $U_{dcref}$ and $U_{dc}$ are the command value and measured value of the DC voltage respectively, the error signal between the two values is sent to the DC voltage loop PI controller, whose output is the command value $i_{gdref}$ of the grid-side d-axis current, the command value $i_{gdref}$ of the grid-side q-axis current is set to zero; the error signal of the grid-side d and q-axis current is sent to the grid-side current loop $PI_g$ controller, whose output is the d and q-axis components $V_{gd}$ and $V_{gq}$ of the grid-side converter modulated voltage, and after coordinate transformation of $V_{gd}$ and $V_{gq}$, the converter modulated voltage $V_{g*}$ in the three-phase AC coordinate system is obtained. The rotor side converter RSC control comprises a speed loop, an outer reactive power loop, and an inner rotor current loop, $P_e$ is the output active power of WTs, which is sent to the MPPT control to obtain the speed command value, the error command between the speed $\omega_r$ and the speed command $\omega_{rref}$ is sent to the speed loop PI controller, whose output is the command value $i_{rdref}$ of the d-axis of the rotor current, the error signal of the d-axis of the rotor current is sent to $Q_{ref}$ as the reactive power command value of the wind turbine, $Q_e$ is the measurement value of the reactive power, the error between the two values is sent to the reactive loop $PI_Q$ controller to obtain the q-axis command value $i_{rqref}$ of the rotor current, component error between the d-axis and q-axis of the rotor current is sent to the current loop $PI_c$ controller to obtain the d and q-axis components $V_{rd}$ and $V_{rq}$ of the machine-side converter modulated voltage, and after coordinate transformation of $V_{rd}$ and $V_{rq}$, the converter modulated voltage $V_{r*}$ in the three-phase AC coordinate system is obtained. Since the disclosure focuses on the electromechanical time scale, it is believed that the current can quickly track the commands, that is, the control dynamic process of the current loop can be ignored.

Figure 4:
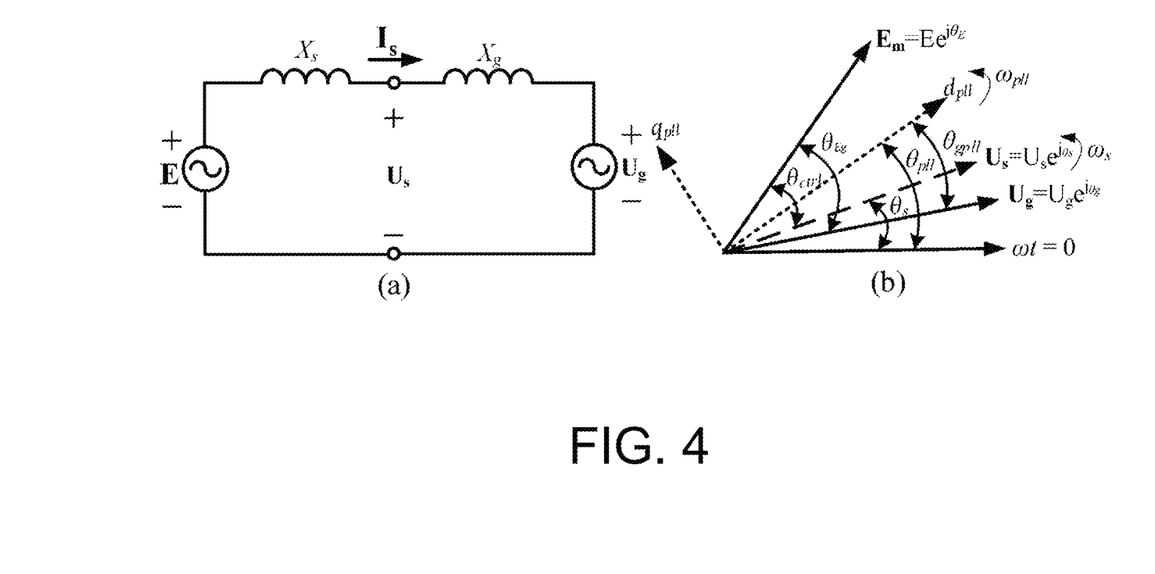
FIG. 4 is a circuit diagram of a DFIG-based WT according to an embodiment of the disclosure, in which (a) is an equivalent circuit diagram, and (b) is a vector diagram.

The equivalent circuit of the stator-side DFIG-based WT is shown in (a) in FIG. 4. The inner voltage vector E is defined as $E=jX_m I_r$, in which $X_m$ is the mutual inductance of the doubly-fed motor, $X_S$ is the stator reactance, $I_S$ and $U_S$ are the stator current and stator voltage (grid point voltage) vector respectively.

The vector relationship diagram of the DFIG-based WT is shown in (b) in FIG. 4, in which $U_g$ is the grid voltage vector; $d_{pll}$ and $q_{pll}$ are the d-axis and q-axis of the phase-locked coordinate system respectively; $\theta_s$, $\theta_{pll}$, and $\theta_E$ are the stator voltage phase angle, phase-locked angle, and internal voltage phase angle respectively; $\theta_{ctrl}$ is the angle between the internal voltage E in the phase-locked coordinate system; and $\theta_{Eg}$ is the angle between the internal voltage E and the stator voltage $U_g$.

Specifically, when a frequency accident occurs in the system and the phase $\theta_g$ of the grid voltage $U_g$ changes, the phase angle $\theta_{pll}$ output by the new phase-locked loop changes rapidly following the terminal voltage phase angle $\theta_s$. When the difference in frequency of each node in the system is ignored, $\Delta\theta_g \approx \Delta\theta_s \approx \Delta\theta_{pll}$; and when a frequency drop occurs in the system, for example, after the phase angle step is triggered, the angle $\Delta\theta_{Eg}$ between the internal voltage E and $U_g$ becomes large, and the output active power of the wind turbine increases, thereby supporting the system frequency dropping.

Figure 5:
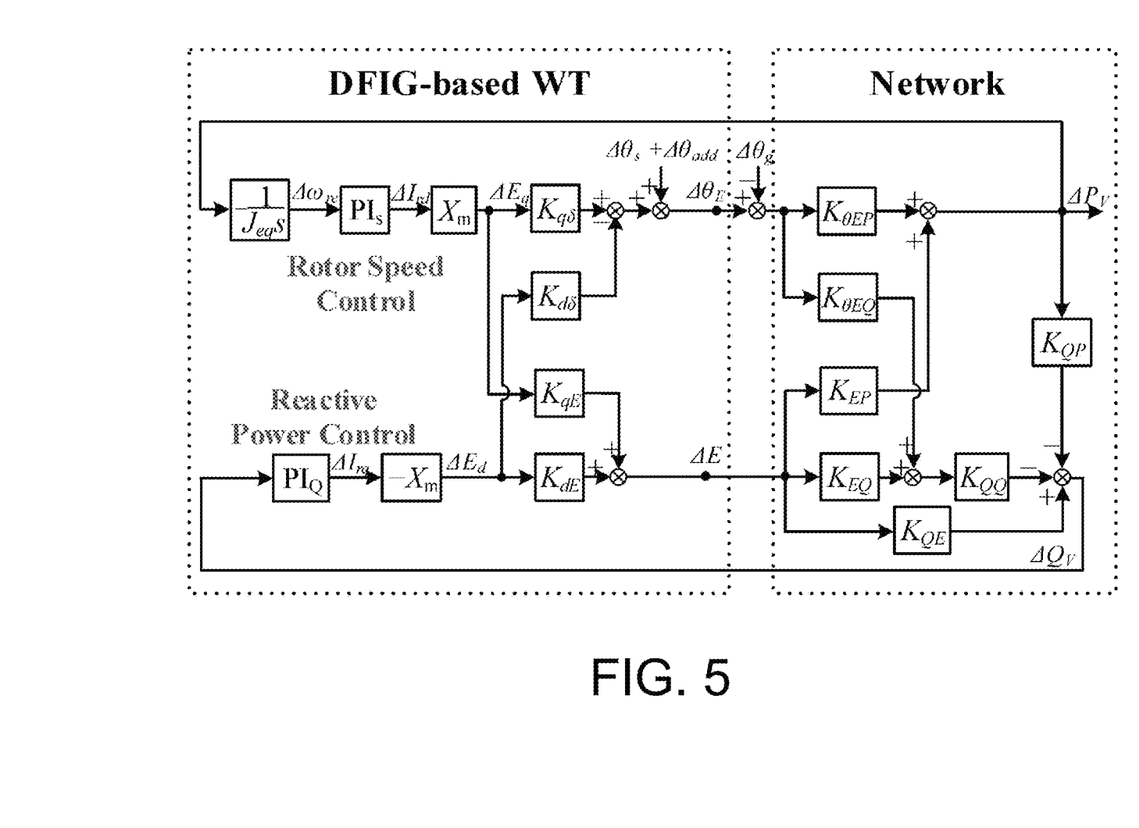
FIG. 5 is a block diagram of a power response transfer function of the wind turbine after phase angle disturbance according to an embodiment of the disclosure.

Specifically, FIG. 5 shows the transfer function block diagram of the power response of a DFIG-based WT after a frequency accident occurs. $J_{eq}$ is the transfer function of the mechanical inertia of the wind turbine; $K_{d\delta}$, $K_{q\delta}$, $K_{dE}$, and $K_{qE}$ are the d and q axis phase angle coefficients and amplitude coefficients respectively; $K_{\theta EP}$, $K_{\theta EQ}$, $K_{EP}$, and $K_{EQ}$ are phase angle active coefficient, phase angle-reactive coefficient, amplitude-active coefficient, and amplitude-reactive coefficient respectively. When there is no additional phase angle step, $\Delta\theta_s - \Delta\theta \approx 0$, at this time, the output power of the wind turbine $\Delta P_V \approx 0$, and neither the speed loop nor the reactive power loop operates.

Specifically, after a frequency accident occurs, according to FIG. 5, the change in active power output of a wind turbine during the dynamic process is as follows.

$$P_V = -\frac{U_{g0}\sin(-\theta_{gpll0})}{X_s + X_g}X_m PI_Q \Delta Q_V +$$

$$\frac{U_{g0}\cos(-\theta_{gpll0})X_m PI_s}{X_s + X_g}(\Delta\omega_r - \Delta\omega_{rref}) + \frac{E_0 U_{g0}\cos\theta_{Eg0}}{X_s + X_g}(\Delta\theta_{add} + \Delta\theta_{pll} - \Delta\theta_g)$$

$\theta_{gpll}$ represents the angle between the grid voltage and the d-axis coordinate system of the phase-locked loop, "$\Delta$" represents the deviation from the steady-state value in the dynamic process, and the subscript "0" represents the steady-state value of each variable. According to the above formula, it can be seen that the change in output active power during the dynamic process is related to the dynamic process of reactive power control, the dynamic process of speed control, and the additional phase angle $\Delta\theta_{add}$. Since $\sin\theta_{gpll0}$ in the first term is usually small, it is generally not considered to modify the reactive power loop to achieve inertia response characteristics; the second term is the speed loop. Existing strategies usually add the df/dt signal to the speed loop after filtering. However, since the response speed of the speed control is affected by the mechanical part and the frequency drop process is usually slow, resulting in a slow inertia response speed of the fan during the control of df/dt; the third term is related to the difference between the phase angle of the phase-locked loop output and the phase angle of the power grid. Existing strategies have proposed adding the df/dt signal to the phase-locked loop after passing through the filtering link. Due to the filtering link and the frequency drop process being slow, the response speed of this strategy is also slow. Since the coefficient in front of the third term is a constant, when the disclosure proposes adding a phase angle step signal to the phase locking angle, an instantaneous response of active power can be achieved, thereby a fast inertia response speed is achieved.

Embodiment 2

Furthermore, in order to illustrate the performance of the phase-locked loop optimization method for ultra-fast frequency support for power electronic converters provided by the disclosure, this method was compared with the frequency support characteristics of DFIG-based WTs under typical phase-locked control. Compared with inertia-free control and classic df/dt control respectively, the effectiveness of the disclosure is verified.

In order to further illustrate the control effect of the phase-locked loop optimization method for ultra-fast frequency support for power electronic converters proposed by the disclosure, the following is illustrated along with a specific implementation.

This embodiment uses 100 aggregated 1.5 MW doubly-fed wind power plants as an example to conduct simulation research. The system parameters of the DFIG-based WTs are as shown in Table 1; at t=50s, a 50 MW load is put into the system to simulate frequency events in the system.

TABLE 1

System Parameters of DFIG-based WTs

| Parameter | Symbol | Value |
| --- | --- | --- |
| Rated power | $P_{sN}$ | 1.5 MW |
| Rated stator voltage | $U_{sN}$ | 690 V |
| Rated grid frequency | $f_{sN}$ | 50 Hz |
| Number of pole pairs | $p_{sN}$ | 2 pairs |
| Stator and rotor ratio | $n_{sr}$ | 1:2.5 |
| Stator resistance | $R_s$ | 0.023 p.u. |
| Stator leakage inductance | $L_{ls}$ | 0.18 p.u. |
| Rotor resistance | $R_r$ | 0.016 p.u. |
| Rotor side leakage inductance | $L_{lr}$ | 0.16 p.u. |
| Mutual induction | $L_m$ | 2.9 |
| Rated DC bus voltage | $U_{dc}$ | 1200 V |
| Wind speed | V | 10 m/s |

Specifically, the phase-locked loop structure and parameter settings in each scenario in the embodiment are as follows.

Scenario I: No inertia control
Scenario II: Additional d f/dt control in rotor speed loop
Scenario III: Phase angle step control according to the disclosure In order to compare the advantages and disadvantages of different control methods, the active power amplitudes of the two are controlled to be the same, and then the differences of each indicator are compared to measure the advantages and disadvantages of each inertia control.

Figure 6:
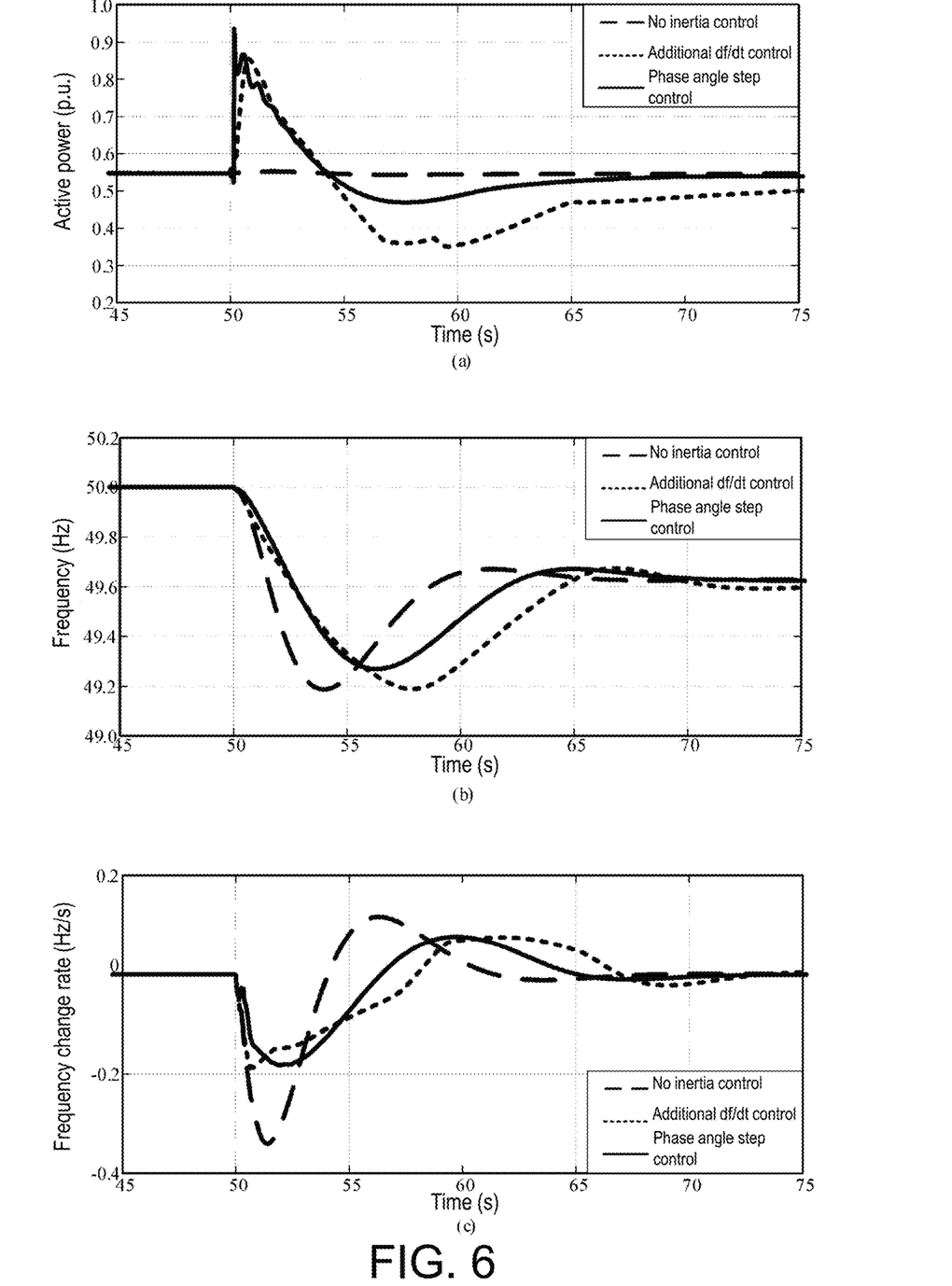
FIG. 6 is a comparison diagram of the output of the DFIG-based WT under three different control scenarios, in which (a) is the output active power waveform diagram, (b) is the system frequency waveform diagram, and (c) is the system frequency change rate waveform diagram.

(a) of FIG. 6 shows the output active power of the DFIG-based WT, (b) of FIG. 6 shows the system frequency, and (c) of FIG. 6 shows the frequency change rate. It can be seen from FIG. 6 and Table 2 that when the system frequency drops, in scenario I, when no additional control is used, the output active power of the wind turbine remains almost unchanged, and thus the system frequency drops rapidly, causing the frequency nadir $f_{nadir}$ to be small and the frequency change rate to be large, which are 49.19 Hz and 0.342 Hz/s respectively. In scenario II, when df/dt control is adopted, although the output of the wind turbine has significantly improved the frequency change rate (0.188 Hz/s), the inertia response speed is slow, the time for the active power to rise to 90% of the peak value is 852 ms, the response speed is slow, and the active power in the active power absorption stage is small, thereby the support effect at the lowest point of frequency is poor (49.19 Hz). In scenario III, when phase angle step control is adopted, it can be seen that the inertia response of the DFIG-based WT occurs instantaneously, the time for the active power to rise to 90% of the peak value is merely 221 ms, and the response speed is significantly improved. Therefore, the support effect is also significantly improved on the frequency change rate (0.182 Hz/s). Also, since the amplitude of the active absorption stage is small, the support effect on the lowest point of frequency is significant (49.27 Hz).

TABLE 2

Various Indicators under Different Inertia Control

| Control method | rise time (ms) | |RoCoF|$_{max}$ (Hz/s) | $f_{nadir}$ (Hz) |
| --- | --- | --- | --- |
| No inertia control | \ | 0.342 | 49.19 |
| df/dt control | 852 | 0.188 | 49.19 |
| Phase angle step control | 221 | 0.182 | 49.27 |

Persons of ordinary skill in the art can understand that all or part of the steps in implementing the methods of the above embodiments can be completed by instructing relevant hardware through a program, and the program can be stored in a non-transitory computer-readable storage medium, when the program is executed, each step of the disclosure provides a phase-locked loop optimization method for ultra-fast frequency support for power electronic converters. The storage media includes but is not limited to: ROM/RAM, magnetic disks, optical disks, etc.

It is easy for persons skilled in the art to understand that the above descriptions are merely preferred embodiments of the disclosure and are not intended to limit the disclosure. Any modifications, equivalent substitutions, and improvements, etc., made within the spirit and principles of the disclosure should all be included in the protection scope of the disclosure.

What is claimed is:

1. A phase-locked loop optimization method for ultra-fast frequency support for power electronic converters, comprising:
    in response to a frequency accident in a new energy power system being detected, triggering phase angle step control immediately, wherein a specific control process is as follows:
        obtaining an initial moment measured when the frequency accident occurs, a trigger moment of the phase angle step control, and a system frequency at the trigger moment of the phase angle step control and calculating a phase angle difference;
        superimposing the phase angle difference to an original output angle of a phase-locked loop to obtain a new output angle of the phase-locked loop; and
        using the new output angle in all coordinate transformation links of new energy power generation control except the phase-locked loop.

2. The method as claimed in claim 1, wherein a determining criterion for the frequency accident in the new energy power system is as follows: a frequency change rate of a grid connection point of a power electronic converter exceeds a preset value of the frequency change rate or a frequency deviation of the grid connection point of the power electronic converter exceeds a preset value of the frequency deviation.

3. The method as claimed in claim 2, wherein the preset value of the frequency change rate is 0.3 Hz/s, and the preset value of the frequency deviation is in a range of 0.03 Hz to 0.1 Hz, wherein the ranges of the frequency deviation and the frequency change rate is not specific and is modified according to different scenarios.

4. The method as claimed in claim 1, wherein a calculation formula of the phase angle difference $\Delta\theta_{add}$ is as follows:

$$\Delta\theta_{add}=K*f_0-f_1/t_1-t_0, \text{ wherein}$$

K is a step coefficient, $t_0$ is the initial moment when the frequency accident occurs, $f_0$ is an initial steady-state frequency when the frequency accident occurs, $t_1$ is the trigger moment of the phase angle step control, and $f_1$ is the system frequency at the trigger moment of the phase angle step control.

5. The method as claimed in claim 1, wherein the original output angle of the phase-locked loop is a phase of a stator three-phase AC voltage obtained through the phase-locked loop.

6. The method as claimed in claim 1, wherein the method is applicable to any phase-locked loop without additional control.

7. A phase-locked loop optimization device for ultra-fast frequency support for power electronic converters, comprising:
    a processor and a storage; wherein
        the storage is configured to store computer execution commands; and
        the processor is configured to execute the computer execution commands so that the method as claimed in claim 1 is performed.

8. A non-transitory computer-readable storage medium, wherein the non-transitory computer-readable storage medium stores a computer program, and in response to the computer program being executed by a processor, operations of the phase-locked loop optimization method as claimed in claim 1 are implemented.

* * * * *